United States Patent [19]
Hartig et al.

[11] Patent Number: 5,382,126
[45] Date of Patent: Jan. 17, 1995

[54] MULTICHAMBER COATING APPARATUS

[75] Inventors: Klaus Hartig, Brighton, Mich.;
Joachim Szczyrbowski, Goldbach, Germany

[73] Assignee: Leybold AG, Hanau, Germany

[21] Appl. No.: 39,865

[22] Filed: Mar. 30, 1993

[30] Foreign Application Priority Data

Mar. 30, 1992 [DE] Germany .............................. 4210346
Feb. 6, 1993 [DE] Germany .............................. 4303462

[51] Int. Cl.⁶ ..................... C23C 16/54; C23C 17/00; B65G 49/06
[52] U.S. Cl. .................... 414/217; 118/719; 118/729; 204/298.25
[58] Field of Search ................ 414/217; 118/719, 723, 118/729; 204/298.25, 298.35

[56] References Cited
U.S. PATENT DOCUMENTS

| | | | |
|---|---|---|---|
| 3,568,632 | 3/1971 | Cawthon ............................ | 118/719 |
| 3,584,847 | 6/1971 | Hammond, Jr. et al. ...... | 118/719 X |
| 3,667,626 | 6/1972 | Torelli et al. ...................... | 414/217 |
| 3,945,911 | 3/1976 | McKelvey ...................... | 204/298.25 |
| 4,764,076 | 8/1988 | Layman et al. .................... | 414/217 |
| 4,812,101 | 3/1989 | George et al. ................. | 414/217 X |
| 4,816,638 | 3/1989 | Ukai et al. ................. | 204/298.35 X |
| 4,911,815 | 3/1990 | Kamei et al. ................. | 204/298.25 |
| 5,215,420 | 6/1993 | Hughes et al. ....................... | 414/217 |
| 5,266,116 | 11/1993 | Fujioka et al. .................. | 118/719 X |
| 5,275,709 | 1/1994 | Anderle et al. ................. | 118/719 X |

*Primary Examiner*—David A. Bucci
*Attorney, Agent, or Firm*—Felfe & Lynch

[57] ABSTRACT

A transport car open at the top and supported on rollers moves a substrate from a first coating chamber to a second coating chamber separated by a gate 7 running transversely of the direction of movement of the transport car 5. The gate 7 is formed of an upper gate part 8 and a lower gate part 9 forming a slot 10 which is adaptable to the cross section of the car. A cover associated with the top gate part and parallel to the direction of movement has an area greater than the car in order to minimize gas transfer between chambers.

13 Claims, 6 Drawing Sheets

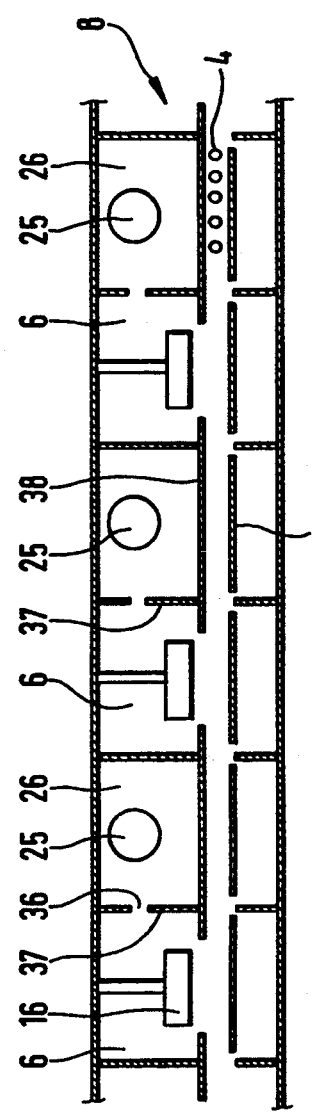
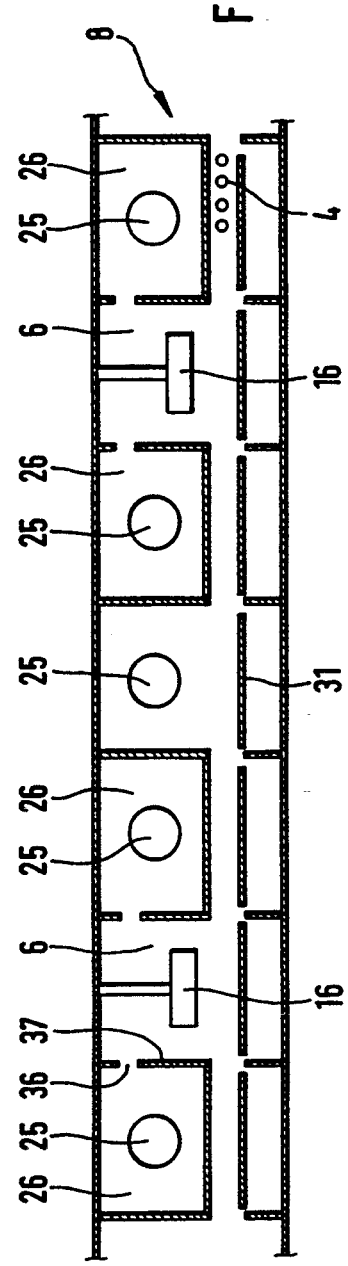
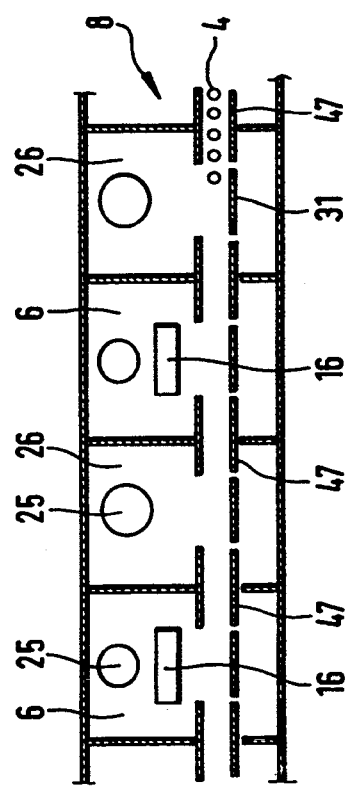

MULTICHAMBER COATING APPARATUS

BACKGROUND OF THE INVENTION

The invention relates to a multichamber coating apparatus with a system for the transport of substrates on a car which is open at the top and supported on gliding means. The car is moved from one coating chamber to at least one additional coating chamber separated by a gate running transversely of the direction of movement of the car. The gate includes an upper gate part and a lower gate part disposed at a distance therefrom and forming a slot.

A multichamber coating apparatus of this type for transporting glass slabs is disclosed in British Application Nos. 2,171,119, and 1,604,056, and U.S. Pat. Nos. 4,274,936, and 4,009,090. Since in the case of flat glass the cross section is very small, it has heretofore been possible largely to disregard the occurrence of gas transfer between two coating chambers. If, however, the individual coating chambers are situated in tandem, and if another coating is to take place in each successive coating chamber, a transfer of gas between the individual coating chambers is inappropriate, because in the case of a gas transfer there will be a reduction in the quality of the different coatings. Accordingly, the invention is addressed to the problem of creating a separation of gases between two chambers.

SUMMARY OF THE INVENTION

The cross-section of an opening between two coating chambers is adapted to the cross section of the car and the substrate. In this manner, very bulky, especially curved, sheet glass can easily be coated in a multi-chamber coating apparatus and brought from one coating chamber into an adjacent coating chamber without the occurrence of significant gas transfer between the individual chambers. In this manner the cycle time of the substrate in the individual chambers can be substantially reduced, and a perfect coating can be achieved.

To this end it is advantageous that the opening between two coating chambers is defined by an upper gate part and a lower gate part, at least one gate part being disposed for movement vertically and/or laterally. This makes possible a quick adaptation of the cross-sectional opening to different sizes. It is also possible for at least parts of the gate to be swung away laterally or folded downwardly.

The walls of the transport car running transversely to the direction of movement may be at a distance from the adjacent wall of the adjacent transport car that corresponds approximately to (or is less than) the length of the cover plate. In this manner, even when a plurality of transport cars is used, the gate opening will remain closed in every position even when the transport car is situated at its coating station.

The position of at least one of the adjustable gate parts can be varied by an adjusting means according to the movement of the transport vehicle, the adjusting means being controlled by a pickup or sensor. In this manner the gate opening can be varied in cross section according to the speed of transport.

It is also advantageous that the total area of the cover plate corresponds approximately to (or is greater than) the total area of the cross-sectional opening of the transport car.

By the bipartite configuration of the gate, an opening which can be precisely matched to the height of the transport car is provided. The transverse wall between chambers preferably comprises two parallel wall parts between which an additional wall is held for displacement by the adjusting apparatus such as a hydraulic cylinder.

Advantageously, the transport car rests on rollers which are mounted to side walls of the coating chamber. A floor under the transport car is preferably made to be raised and lowered with an actuator, so that it can be adapted to the particular height of the transport car. The wheels can be adjusted with the floor, or the wheels can be variable in their height with respect to the floor, so that they can be adapted to the different heights of the transport car. The height of the floor and/or the wheels can be adjusted by hydraulic cylinders or a gear drive with a rack and a powered pinion.

To assure the perfect coating of the substrates in the various coating stations with different materials, an exhaust can be provided in each coating chamber, to aspirate gas from the coating chamber and further prevent gas transfer between the individual coating chambers.

The exhaust may be provided in the floor of the coating chamber and/or intermediate chamber, and for two or more chambers each having an exhaust, on both sides of the coating chambers. It is thus possible to perform both a degassing and a cleaning of the transport car, so that no dirt particles or gas components are transferred with the car. In this manner the substrate can be coated with various materials without problems in the individual coating stations, and the individual coatings can have a high purity.

BRIEF DESCRIPTION OF THE DRAWINGS

FIGS. 6a to 6e show several embodiments of multichamber coating apparatus having intermediate chambers between the coating chambers.

DETAILED DESCRIPTION OF THE PREFERRED EMBODIMENT

Figure 1:
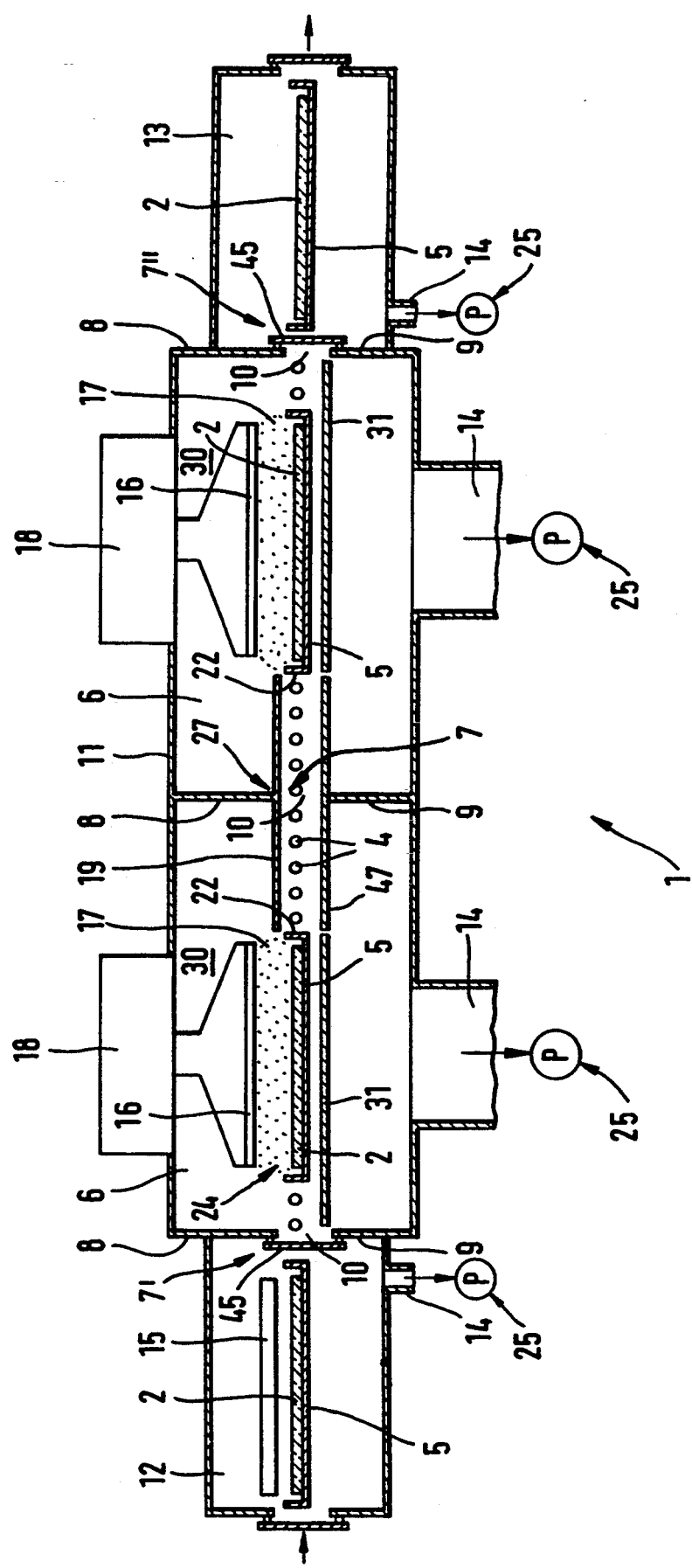
FIG. 1 is a diagrammatic cross section of a multichamber apparatus with a device for the transport of substrates.

Referring to FIG. 1, the multichamber coating apparatus 1 includes an open-topped transport car 5, supported by rollers 4, on which the sheet glass 2 is placed. The car is driven from a forechamber 12 to a first coating chamber 6, then to an additional coating chamber 6.

From the final coating chamber 6 the substrate passes through a gate 7" to the venting chamber 13, which can also be used for the after-treatment of the coatings. In FIG. 1 only the principle of an automated sputtering apparatus is represented. Single-chamber production apparatus or multichamber production apparatus can be equipped according to this principle.

The forechamber 12 has the purpose of improving the cleanliness of the coating space and thus of shortening the loading time. The preliminary treatment of substrates is of great advantage for this purpose.

According to FIGS. 1 to 5, glass 2 passes through the forechamber 12 and a first gate 7' into a first coating chamber 6 and from there through an additional or second gate 7 to a second coating chamber 6, and finally through an additional or third gate 7" to the venting chamber 13, which can also be used for the after-treatment of the coatings. The first and last gates, 7' and 7", can shut the forechamber 12 and the venting chamber 13, respectively, completely off from the coating chambers 6, while the middle gate 7, on the other hand, has a slot opening 10. In accordance with FIGS. 6a to 6e the glass passes through additional coating chambers and intermediate chambers.

The forechamber 12 of the coating chamber 6 is evacuated by one or more pumps 25, and through one or more outlet openings 14. According to FIGS. 6a and 6b the pumps 25 or pump inlet openings may also be provided in the coating chambers 6 or the intermediate chambers 26.

The multichamber sputtering system can be equipped with a direct-current or a high-frequency diode system. In FIG. 1 a heating device 15 is indicated in the forechamber 12, while in the coating chamber 6 a target 16, a plasma 17, the car 5 with the substrate 2 as well as an adapting means 18 of a high-frequency supply, are indicated.

The first and last gates 7' and 7" as well as the gate 7 provided between two coating chambers 6 each include an upper gate part 8 and a lower gate part 9 disposed at a distance therefrom and forming a cross-sectional opening 10 therebetween. The gates 7' and 7" have gate doors 45 which are raised when the car 5 with the substrate 2 passes through. The gate doors 45 can also be arranged to be folded downward or upward or sideways.

The gate 7 provided between the two coating chambers 6 consists of an upper gate part 8 whose bottom edge 27 (FIG. 1) adjoins a horizontally disposed cover plate 19 which, when the transport car 5 changes from the one coating chamber 6 to the other coating chamber 6, lies above the open-topped cargo part of the transport car 5 and thus contributes to keeping the slot opening 10 as small as possible and minimizing gas exchange between two adjacent coating chambers 6.

Below the cover plate 19 is a second cover plate 47 (FIGS. 4, 5) at a distance from cover plate 19, forming an opening 10 that accommodates the car 5. The wheels 4 are housed in box-like structures 30 which prevent gas transfer on either side of the car 5. The structures 30 have openings 32 in the top which expose the tops of the wheels to support the flange 29 of car. As an alternative to the hollow box-like structures 30, solid blocks having cylindrical cavities for the wheels may be provided. This would eliminate any gas transfer between openings 32 for successive wheels on one side of the car.

Figure 4:
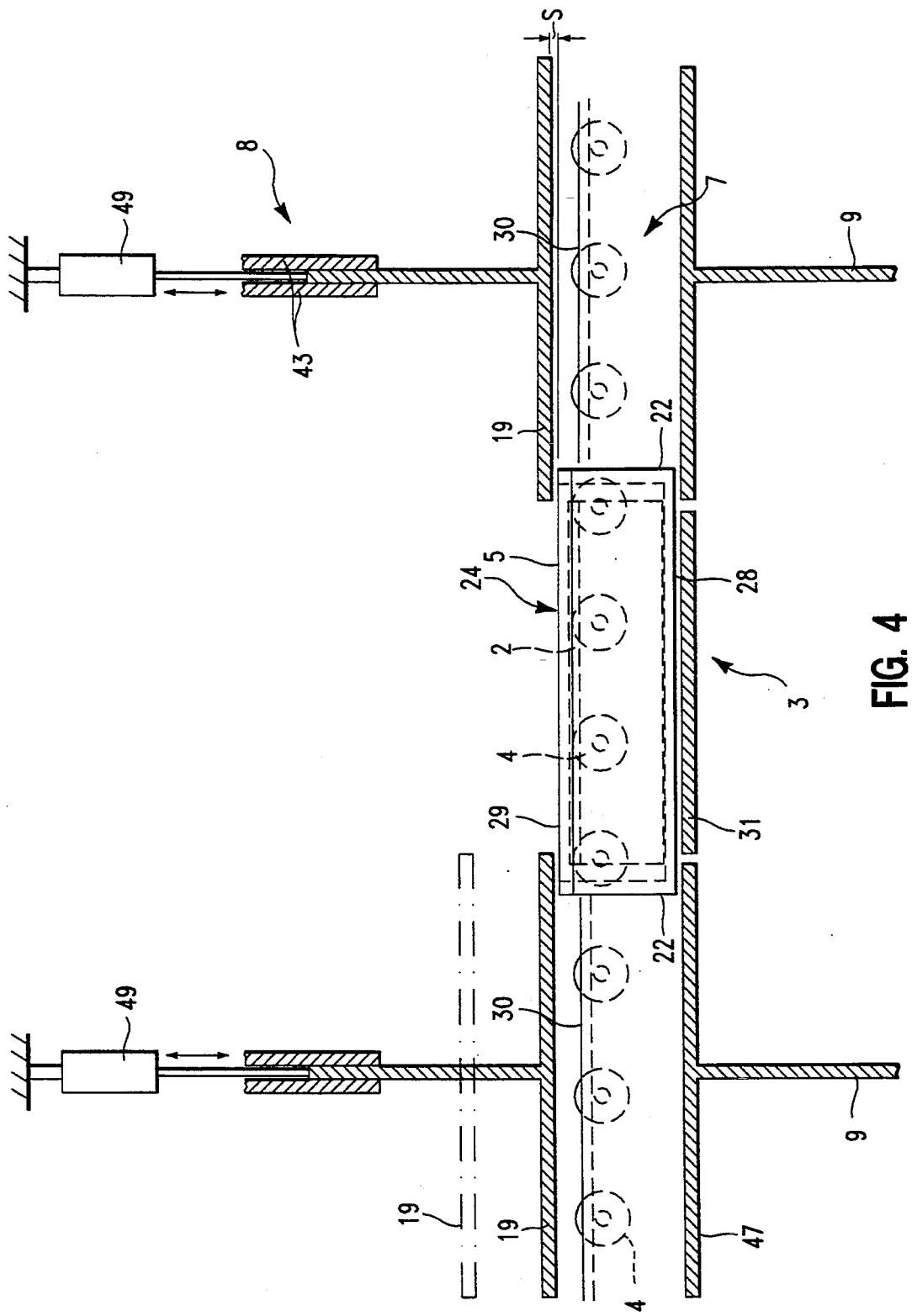
FIG. 4 is a diagrammatic representation of the gate with a horizontally disposed plate.
Figure 5:
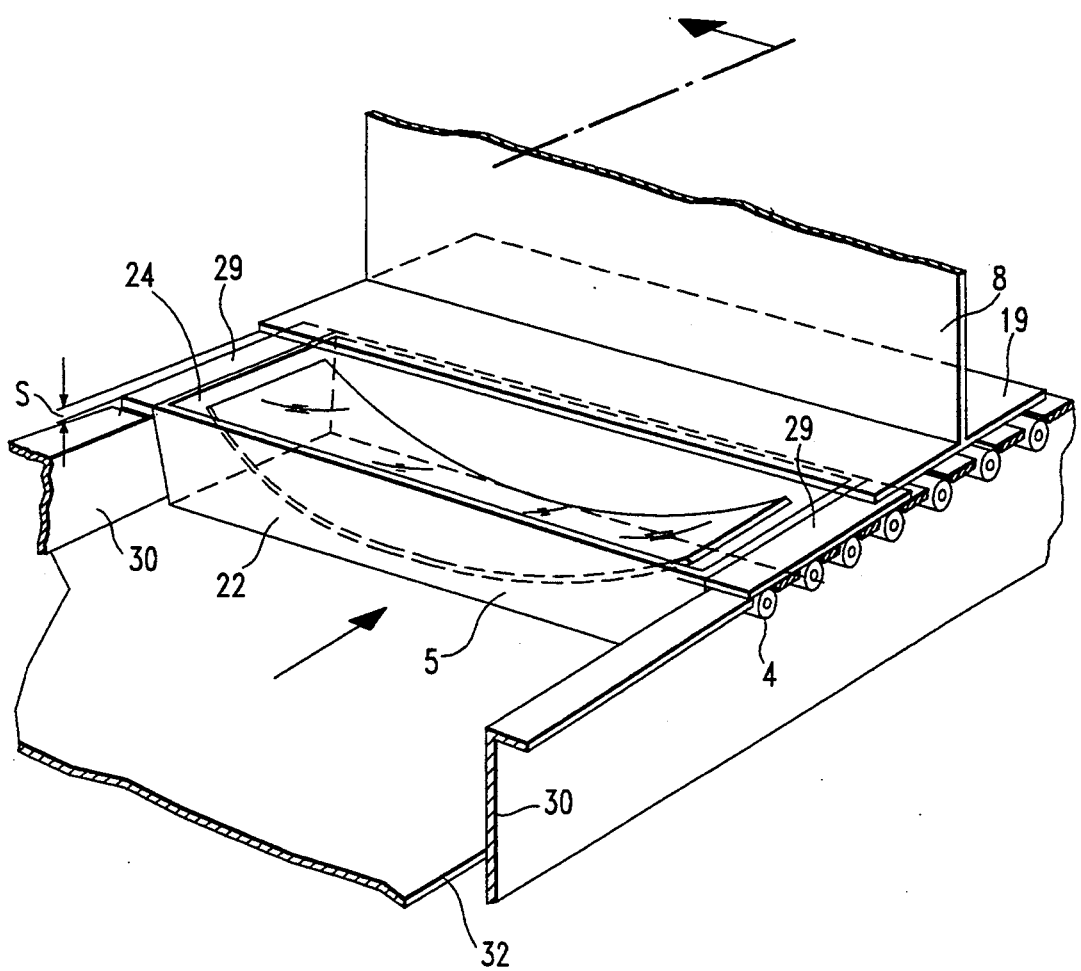
FIG. 5 is a perspective view of the transport car as it is introduced into the cross-sectional opening of the gate.

In accordance with FIGS. 1, 4 and 5, the cover plate 19 has an area corresponding to (or greater than) the upwardly facing cross-sectional opening 24 of the transport car 5, so that when the transport car 5 is changed from the one coating chamber 6 to the other coating chamber 6 the slot opening 10 will not be enlarged. Only a minimal gap S (FIG. 5) is provided between the bottom of the cover plate 19 and the top edge of the transport car, but it is so small that no significant gas exchange can take place between the adjacent coating chambers 6. By the movably disposed gate parts 8 and 9 in connection with the cross section of the front wall 22 of the transport car 5, the gap S can be reduced to a few millimeters, i.e., to about 1 to 2 mm.

Figure 3:
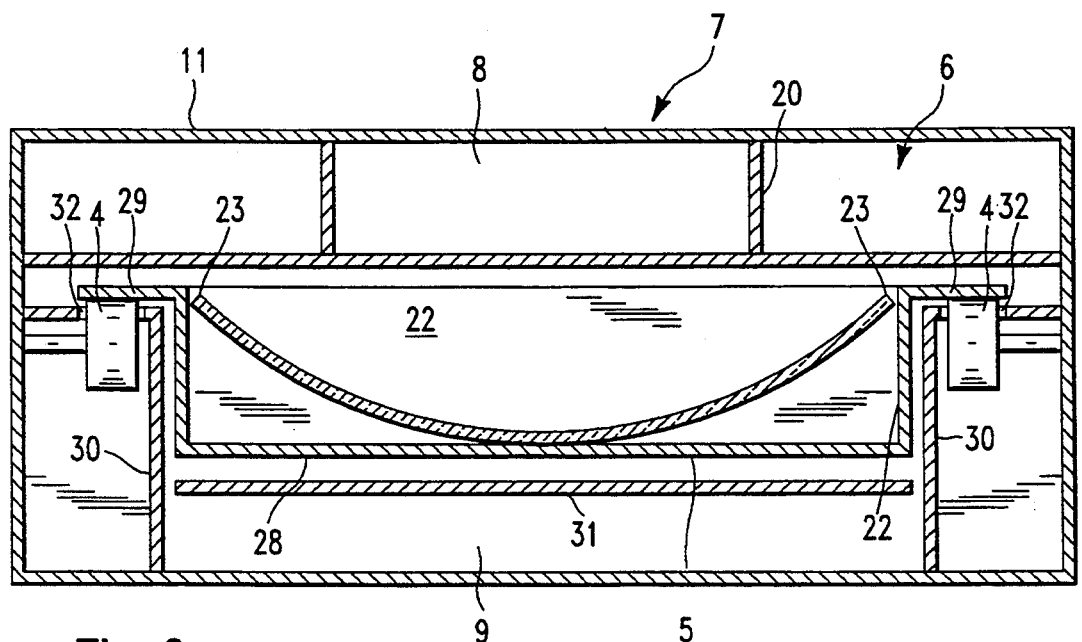
FIG. 3 is a cross section of the gate with a transport car for carrying curved glass.

If curved glass 2 instead of flat glass is carried on the transport car 5, the car 5 will have four lateral walls 22 which terminate approximately at the same level as a top edge 23 of the curved glass 2 (FIG. 3). In this manner the slot 10 is closed by the transport car 5 and the gas transfer is minimized. Any remaining gas is pumped away through the pumps 25 and outlet openings 14. In this manner, sputtering sputtering can be performed reactively in the one chamber using a reactive gas, and in an adjoining chamber a different gas can be employed.

Figure 2:
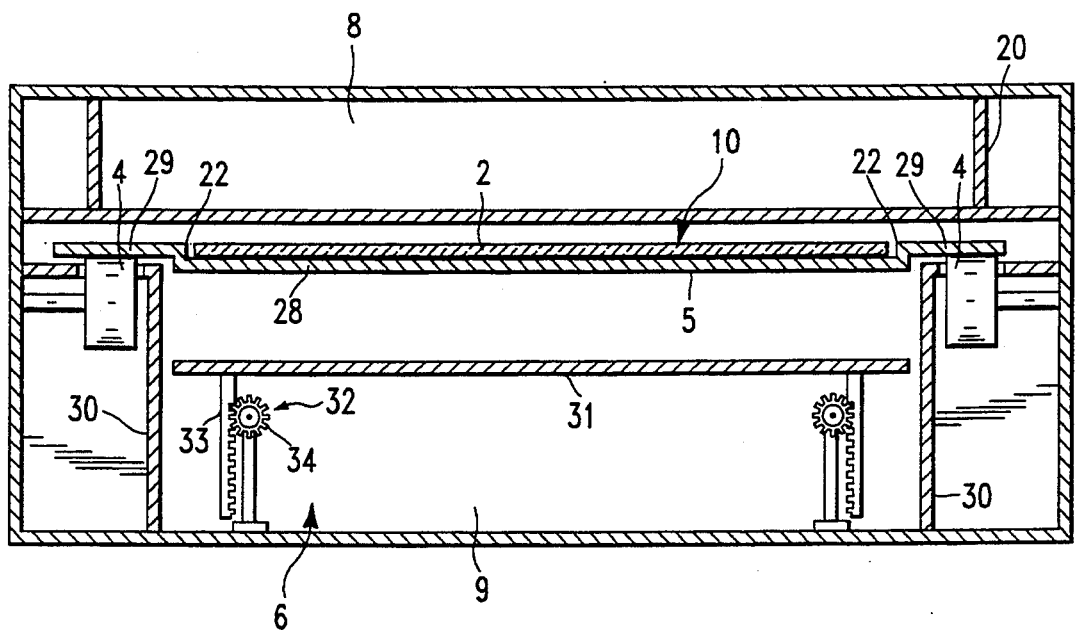
FIG. 2 is a cross section of the gate with a transport car for holding flat glass.

In FIGS. 2 to 5, horizontally disposed flanges 29 are provided on the side wall 22 of the transport car 5 and ride on wheels 4. As seen in FIG. 2 and 3, the wheels 4 are fixed to the side walls 30 of the coating chamber 6, preferably outside of slot 10. The axles on which the wheels are journaled may be arranged to be vertically adjustable.

In accordance with FIG. 2, a floor 31 can be raised and lowered by an elevator device 32, so that it can be adapted to the height of the car 5 and the cover plate 47. The elevator 32 includes a rack 33 disposed on the floor 31 and a pinion 34 which is driven by an electric motor. It is also possible to raise the floor 31 by hydraulic jacks. In either case the floor 31 is closely received between lateral walls of box-like structures 30, which have closed ends to prevent gas transfer between chambers.

As shown in FIG. 4, the cover plate 19 can be raised by a hydraulic jack 49 or a rack with a powered pinion like the elevator 32 for adjusting the floor 31. The transverse wall between chambers has two parallel wall parts 43 between which a gate part 44 is received. When the floor 31 is adjusted, the cover plate 47 is adjusted with it through a device similar to elevator 32. In this manner the slot opening or gate opening 10 can be adapted to different heights of the transport cars 5 without the need for substantial changes on the gates 7 to 7". The position of the target 16 can also be adjusted if necessary.

As seen in the embodiments which are only schematically represented in FIGS. 6a to 6e, several intermediate chambers 26 can be provided between the individual gates 7 to 7". In these examples the previously shown parts have been omitted for the sake of simplicity.

In FIG. 6a, one intermediate chamber 26 is provided between every two gates 7, in which a pump 25 is provided or with which one is associated, which aspirates any gas or impurities that might still be overflowing to some extent, and prevents any gas transfer from occurring between the gas of the one coating chamber 6 and the gas of the following coating chamber 6.

The glass 2 that is to be coated is transported on the wheels 4 without stopping, at constant velocity, through the coating chambers 6 which are disposed in tandem in accord with FIGS. 6a to 6e, and in which the coatings are successively applied.

A wall 37 with an opening 36 is provided between the first coating chamber 6 and the intermediate chamber 26, so that gas can be aspirated in a simple manner from the coating chamber 6 containing the target 16. The intermediate chamber 26 is closed off at the bottom by a floor 38 and evacuated by a pump 25.

In the embodiment shown in FIG. 6b, an intermediate chamber 26 containing a pump 25 adjoins both sides of a coating chamber 6, and it is connected to the coating chamber 6 by an opening 36 provided in the wall 37.

Figure 6D:
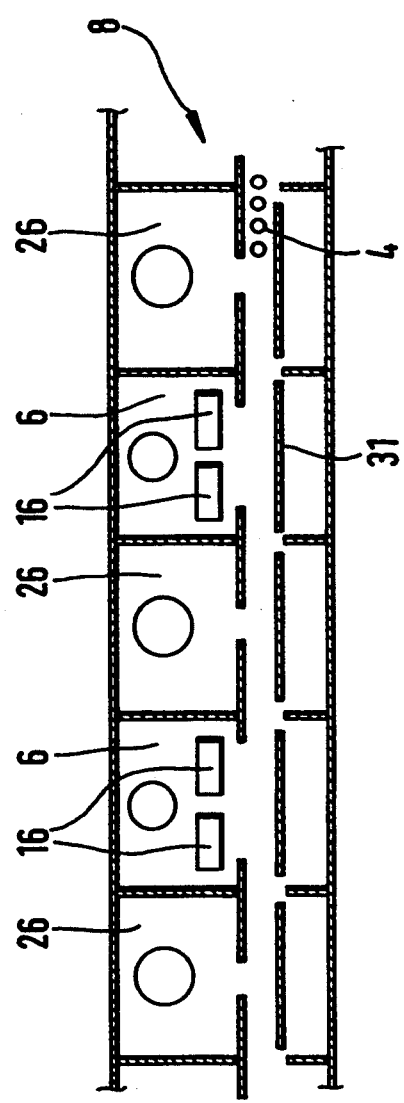

In FIGS. 6c and 6d each of the coating chambers 6 as well as the intermediate chambers 26 adjoining them has a pump 25. The wheels 4 are journaled in box-like structures as in FIG. 2, but for simplicity these structures are not shown here.

Figure 6E:
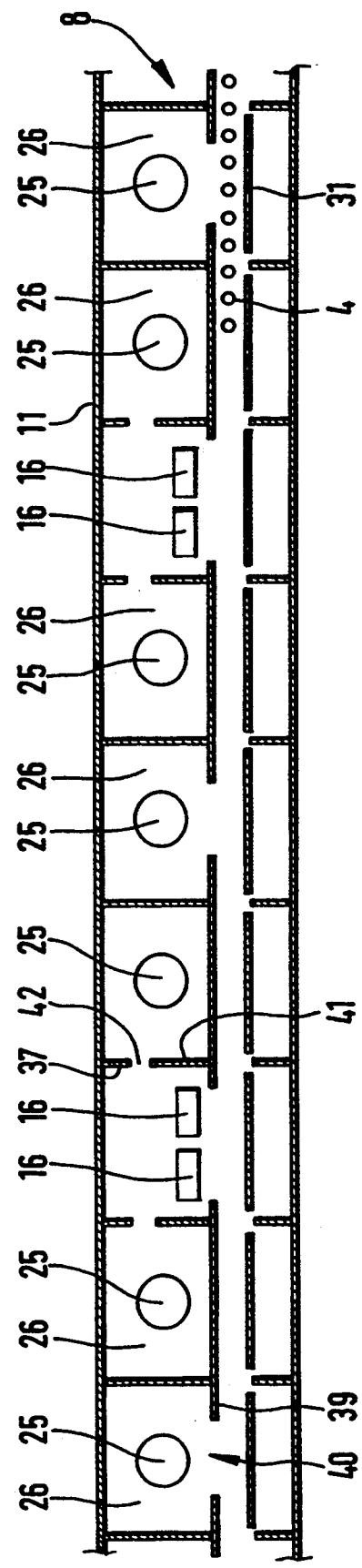

In FIG. 6e, two chambers 26, each with a pump 25, are provided on each side of a coating chamber 6, the outer chambers 26 in each case having a floor 39 with an opening 40, while the two inner chambers 26 have each a wall 41 with an opening 42 connected to the coating chamber 6. In this manner a further improvement of the gas separation can be achieved, so that a clean surface coating is achieved in each coating station. Through the opening 40 the gas in the area of the transport means can advantageously be pumped away, while the coating chamber 6 is pumped out through the opening 42 in the side wall 37.

It is also possible to provide two cathodes and targets 16 in a single coating chamber 6.

The upper part 8 of the gate is fixedly attached to the top 11 of the coating chamber 6, or can be disposed at a distance therefrom. For this purpose spacers 20 (FIG. 2) are provided on the wall 11 on the one hand and on the upper part 8 of the gate on the other.

To enable the width of the slot 10 between the upper and lower parts 8 and 9 of the gate to be matched precisely to the car 5 and substrate 2, the bottom part 9 of the gate is advantageously adjustable vertically by an adjusting means not represented in the drawing. Also, the gate parts can also be shifted horizontally by devices not represented in the drawing.

The transverse walls 22 of the car 5 (FIG. 4) are at a distance apart is less than the length of the cover plate 19, so that the opening 10 is always completely or nearly closed, even if the transport car 5 is not exactly beneath the upper part 8 of the gate, but is, for example, under the target. Gas transfer between the individual coating chambers 6 is thus largely prevented with the transport car in any position.

It is also possible, to adapt the entire cross section of the car 5, as seen in the direction of movement, to various sizes of slot openings 10 in the individual gates 7, 7′, 7″.

For this purpose the side walls of the transport car 5 can be made variable in length or telescoping, and also variable in height, so that substrates 2 of different heights can be accommodated.

We claim:

1. Multichamber coating apparatus for coating a substrate with a plurality of coatings, said apparatus comprising
   a first coating chamber,
   a second coating chamber,
   a wall between said first and second coating chambers, said wall having an opening therethrough, said opening having a cross-section,
   a transport means including a car for carrying said substrate and guide means for guiding said car through said opening in a direction of movement along a path from said first chamber to said second chamber, said car having a cross section transverse to said direction of movement, and
   means for adjusting the cross section of said opening so that said cross section of said opening conforms to said cross section of said car.

2. Multichamber apparatus as in claim 1 further comprising an upper gate part and a lower gate part defining said opening therebetween, said means for adjusting comprising means for moving at least one of said gate parts vertically.

3. Multichamber apparatus as in claim 2 further comprising a cover plate fixed to said upper gate part, said cover plate lying substantially parallel to said direction of movement and having an area and a length in said direction.

4. Multichamber apparatus as in claim 3 wherein said car comprises a pair of walls extending transversely to said direction of movement and separated by a distance which is less than the length of said cover.

5. Multichamber apparatus as in claim 3 wherein said car has an upward facing opening with an area which is less than the area of said cover.

6. Multichamber apparatus as in claim 1 wherein said coating chambers have opposed sidewalls parallel to said direction of movement, said guide means comprising parallel rows of wheels mounted to respective sidewalls.

7. Apparatus as in claim 2 wherein said lower gate part comprises a cover plate which parallels said direction of movement.

8. Apparatus as in claim 7 wherein said means for adjusting the cross section of said opening comprises means for moving said lower gate part vertically.

9. Apparatus as in claim 1 further comprising
   a first intermediate chamber between said first and second coating chambers, said first intermediate chamber having a floor isolating said first intermediate chamber from said path and a wall having an opening connecting said first intermediate chamber said first coating chamber and
   aspirating means for evacuating said first intermediate chamber and said first chamber via said opening.

10. Apparatus as in claim 9 further comprising
    a second intermediate chamber between said first and second coating chambers, said second intermediate chamber having a floor isolating said second intermediate chamber from said path and a wall having an opening connecting said second intermediate chamber to said second coating chamber, and
    aspirating means for evacuating said second intermediate chamber and said second chamber via said opening.

11. Apparatus as in claim 10 wherein said first and second intermediate chambers are outer chambers, said apparatus further comprising
    an inner chamber between said outer chambers, said inner chamber having an opening connecting said inner chamber to said path, and
    aspirating means for evacuating said inner chamber and said path via said opening between said inner chamber and said path.

12. Apparatus as in claim 1 further comprising
    an intermediate chamber between said first coating chamber and said second coating chamber, said intermediate chamber having a floor with an opening connecting said inner chamber to said path, and
    aspirating means for evacuating said intermediate chamber.

13. Apparatus as in claim 1 further comprising aspirating means in at least one of said first and second chambers.

* * * * *